United States Patent [19]
Armstrong, Jr.

[11] 3,935,053
[45] Jan. 27, 1976

[54] PROCESS FOR PREPARING THERMOSETTING LAMINATES

[75] Inventor: Rudolph J. Armstrong, Jr., Hempstead, N.Y.

[73] Assignee: Photocircuits Corporation, Glen Cove, N.Y.

[22] Filed: Oct. 16, 1970

[21] Appl. No.: 69,522

Related U.S. Application Data

[60] Division of Ser. No. 819,093, April 24, 1969, Pat. No. 3,600,247, which is a continuation-in-part of Ser. No. 680,983, Nov. 6, 1967, abandoned.

[52] U.S. Cl. .................... 156/378; 100/48; 100/99; 156/358; 156/64; 156/500; 264/40; 324/65 R; 324/71 R; 425/135
[51] Int. Cl.² ................ G01N 27/00; G01R 27/14
[58] Field of Search ........... 156/378, 351, 358, 381, 156/382, 64, 272, 306, 309, 303, 335, 580; 100/43, 48, 99; 425/135; 264/40; 324/65 R, 71 R; 73/64.1, 150

[56] References Cited
UNITED STATES PATENTS

| | | | |
|---|---|---|---|
| 3,188,853 | 6/1965 | Rosa | 73/15 R |
| 3,248,925 | 5/1966 | Warfield | 73/15 R |
| 3,358,232 | 12/1967 | Dillon | 324/65 R |
| 3,489,833 | 1/1970 | Lehnen | 264/315 |
| 3,510,374 | 5/1970 | Walker | 156/378 X |
| 3,649,729 | 3/1972 | Davis | 264/40 X |

Primary Examiner—Marion E. McCamish

[57] ABSTRACT

An improved method of laminating thermosetting laminates is provided which comprises heating a laminate assembly which comprises a thermosetting resin, measuring the electrical impedance of the thermosetting resin to ascertain its lowest point, and applying full laminating pressure to the heated laminate assembly at that point of increased electrical impedance occurring subsequent to the ascertained lowest point of electrical impedance. An additional improvement is provided which consists of heating a laminate assembly which comprises a thermosetting resin, measuring the electric current generated by heating the thermosetting resin to ascertain its highest point and applying full laminating pressure to the heated assembly at that point of decreased generation of electric current occurring subsequent to the ascertained highest point of electric current.

Furthermore, an improved press is provided which is adapted with electrical sensing means to determine the gel stage of the thermosetting resin of a heated thermosetting laminate assembly. Lastly, an improved process of preparing multilayer circuit laminates is provided which comprises treating the surface of a fully cured laminate circuit layer having printed, metallic circuit pattern surfaces with a laminating adhesive resin prior to lamination.

5 Claims, No Drawings

PROCESS FOR PREPARING THERMOSETTING LAMINATES

CROSS-REFERENCES TO RELATED APPLICATIONS

This application is a division of U.S. application Ser. No. 819,093, filed Apr. 24, 1969, now U.S. Pat. No. 3,600,247, which in turn is a continuation-in-part of U.S. application Ser. No. 680,983, filed Nov. 6, 1967, now abandoned. Generally stated, the subject matter of the present invention relates to the process of preparing thermosetting laminates. More particularly, the invention relates to the improved process of preparing thermosetting laminates which comprises electrically determining the gel stage of a thermosetting resin so as to insure the application of full laminating pressure to a heated laminate assembly at the proper time to achieve successful interlaminar bonds.

BACKGROUND OF THE INVENTION

Almost all process difficulties occasioned by laminate inconsistencies can be explained by some failure of control in the manufacture of the laminates. Laminates, as the name implies, are composed of layers of materials united by a binding material, Thermosetting laminates are pressed together under heat and pressure to form a dense, consistent, electrical insulator. The basic raw materials of thermosetting laminates are paper, glass, cloth, or glass mat, bonded together with various thermosetting resins, such as phenolic, epoxy or polyester resins.

The first operation in laminate manufacture usually consists of impregnating or coating a base material, such as paper, glass cloth, or other fibrous sheet materials with a thermosetting resin. The resin is partially cured by heating to a point of cure suitable for storage. The base material is passed through a dip tank of resin, then into a set of squeeze rollers and through a drying oven. The resin is partially cured to what is called a B stage, and most of the volatiles in the resin are driven off in the oven. The partially polymerized or semi-cured material is also known as "prepreg", and in general is dry and tack-free.

Rigid process control is maintained during treating in order to monitor the ratio of resin to base material, the final thickness of the prepreg, and the degree of resin cured. However, laminate pressing is both manually controlled and operated. The most modern procedure requires the control of a skilled operator employing a skill based on years of experience to determine operating variables, the most critical of which is the determination of when to apply full laminating pressure to the heated laminate assembly. Usually, uncontrollable variables and differences in judgment have been such that no two operators would follow the same pattern, and seldom would the same operator use an identical pattern on successive batches. The high cost involved, together with the high incidence of poor interlaminar bonds, and the necessity for uniformity, as well as the unavailability of skilled operating personnel have long indicated the desirability of scientific control and automation.

In the process of laminating thermosetting laminates, the point at which full laminating pressure is applied to the heated laminate assembly is critical. This criticality is occasioned by the nature of the thermosetting resins which are irreversible when polymerized. Partially polymerized or semi-cured thermosetting resins liquefy when first heated. The resin then passes to a gel stage and finally sets or polymerizes as a hardened material. The thermosetting resin cannot be liquefied again by heating. Therefore, it is important in setting up a pressing cycle of a laminating process to apply full laminating pressure while the resin is in the gel stage. The premature application of full laminating pressure while the resin is in the liquid stage will result in excess resin being squeezed out of the laminate assembly leaving voids in the finished laminate. Poor interlaminar bonds also result from the application of full laminating pressure when the resin has passed from the gel to the solid stage since there is insufficient resin flow.

Attempts to insure successful interlaminar bonds have primarily involved modification in the press employed. The modification usually resides in the use of a press which is capable of rapid temperature rise. In essence, the pressing cycle is started at room temperature, and the temperature is raised to the gel point of the resin, at which point full laminating pressure is applied. The gel point is ascertained by imbedding a thermocouple in the center sheet of pregreg. This modification while overcoming some of the inherent disadvantages of the process by providing longer gel stages, requires operation by a skilled technician. Furthermore, the incidence of poor interlaminar bonds is not significantly reduced since the temperature at which a particular resin achieves its gel stage is not constant and is reliant on the temperature history of the B stage of the resin.

Accordingly, it is a primary object of the present invention to provide an improved laminating process which enables the accurate determination of the gel stage of a thermosetting resin so as to insure the application of full laminating pressure at the proper time in the laminate pressing step.

Another object of the present invention is to provide an improved process for laminating multilayer circuit laminates.

It is a further object of the present invention to provide an improved press which is adapted to electrically determine the gel stage of a thermosetting resin.

Yet another object of this invention is to overcome such inherent disadvantages of the prior art laminating process as poor interlaminar bonds, interior voids in the laminate, and the like.

Additionally, it is a further object of the invention to provide successful interlaminar bonds in a multilayer circuit laminate without resorting to roughing the printed, metallic circuit pattern surfaces of the fully cured laminate circuit layers by etching or mechanical abrasion prior to lamination.

Additional objects and advantages of the invention will be set forth in part in the description which follows, and in part will be obvious from the description, or may be realized by practice of the invention, the objects and advantages being realized and attained by means of the methods, processes, instrumentalities and combinations particularly pointed out in the appended claims.

THE INVENTION

To achieve the foregoing objects, and in accordance with its purpose, as embodied and broadly described, the present invention provides an improved laminating process for preparing thermosetting laminates in which the gel stage of the thermosetting resin employed in the laminate is accurately determined by measuring the electrical impedance of the thermosetting resin to ascertain its lowest point and applying full laminating pressure to the heated laminate assembly at that point of increased electrical impedance occurring subsequent to the ascertained lowest point of electrical impedance.

In addition, the present invention also provides for an improved laminating process in which the heating of the thermosetting resin will generate an electric current which can be measured. Therefore, the invention also relates to a process in which the electric current generated by heating the thermosetting resin is measured to ascertain its highest point, and applying full laminating pressure to the heated laminate assembly at that point of decreased electric current occurring subsequent to the ascertained highest point of electric current generated.

The present invention further provides an improved press which is adapted with electrical sensing means to determine the electrical impedance of the thermosetting resin of a heated thermosetting laminate assembly.

Additionally, the present invention also provides an improved process of laminating multilayer circuit laminates which comprises treating the surfaces of the fully cured laminate circuit layers having printed, metallic circuit pattern surfaces with a laminating adhesive resin prior to lamination.

The invention consists of the novel methods, processes, steps and improvements shown and described.

It is to be understood that both the foregoing general description and the following detailed description are exemplary and explanatory but are not restrictive of the invention.

Electrical impedance is defined as the total opposition that a circuit presents to an electrical current, and as herein employed shall be defined to include resistance, inductive reactance, capacitive reactance and conductance which is the reciprocal of resistance. Whereas, the phrase full laminating pressure, shall be defined to mean that pressure necessary to form a dense, consistent laminate, as for example pressures ranging from about 200 to 1500 psi have been employed.

The manner of carrying out the present invention is hereinafter broadly illustrated in the preparation of copper clad laminates, and multilayer circuit laminates.

The present invention is particularly useful in the printed circuit industry in the preparation of metallic clad laminates. Therefore, in addition to the resin impregnated base material, the other principal material is a metal, such as copper foil which is obtained by electrodeposition of copper on large rotating steel drums. Depending on the particular resin employed with the base material, an adhesive resin may be necessary to achieve lamination of the copper to the base material. However, the use of particular epoxy glass laminates avoids the necessity of using an adhesive resin.

Copper clad laminates are usually prepared by first placing copper foil against a large, polished steel pan. A number of sheets of prepreg material are laid on top of the copper, the number of layers employed depending on the desired thickness of the laminate and the characteristics of the prepreg material. One of the sheets of prepreg material, preferably a center sheet, is provided with a contact material at two distinct points employing a probe, which is usually insulated. Next a final sheet of copper foil is placed on top of the prepreg. In those instances in which a single sided copper laminate is to be prepared the top press pan is generally sprayed with a mold release before being laid on top of the prepreg, or the surface of the press pan may be specially treated, as for example by coating the press pan surface with polytetrafluoroethylene.

The assembled components of the laminate are then placed in a press, such as a hydraulic press and the press is closed to contact pressure. Contact pressure is defined as sufficient pressure to press the parts firmly together to provide a thermal path throughout the assembly. One of the contact points of the probe is connected to a source of electrical current, and the second contact point is connected to a standard measuring device, such as a recording voltmeter. When employing an alternating current it is advisable to use lower frequencies in the magnitude of one megahertz, since at lower frequencies impedance may be accurately measured by standard techniques. However, it is preferred to use a direct current potential of 3.2 volts. Depending on the particular press employed, heat will either be applied at this point, or the press will have been preheated to the approximate gel point temperature of the resin.

As the laminate assembly is heated, the electrical impedance is measured and as the resin liquefies impedance decreases. As the resin passes to its gel stage there is an increase in impedance and it is at this point that full laminating pressure should be applied. It is preferred that a time lag of at least 5 to 10 seconds elapse prior to applying full laminating pressures so as to compensate for temperature gradients across the press platens. The time lag thereby insures that the thermosetting resin of the entire laminate assembly has entered into its gel stage. The duration of the time lag is dependent on a variety of factors, the most notable of which are the particular resin employed, and the thickness of the laminate assembly among others.

The presses employed in laminating high pressure thermosetting laminates usually use hydraulic pressure and develop pressures in excess of 1000 psi. Steam is used as the heat source, and the steam is released into each press platen as pressure is applied to cure the assembled components into a final homogeneous laminate. When the cured portion of the pressing cycle is completed, curing is arrested by running cold water through the press platens, and after proper cure the laminate is trimmed.

The preparation of multilayer circuit laminates, which comprise a plurality of interconnected fully cured laminate circuit layers in substantially the same as the process hereinabove described for copper clad laminates. One of the primary differences resides in the components of the multilayer circuit, which comprise fully cured laminate circuit layers having metallic printed circuit pattern surfaces and prepreg. Additionally, the probe employed for determining electrical impedance may be incorporated as part of the circuit layer.

The inherent difficulty of poor interlaminar bonds becomes particularly apparent in the preparation of multilayer circuit laminates, since the problem of uniformity are multiplied and the necessity for successful interlaminar bonds is accentuated, since the economic impact of defective multilayer circuit laminates is greater because of the circuit layers employed in the assembly.

The method of assembling the multilayer circuit laminate is substantially the same as hereinabove described for the copper clad laminates. In essence, the component parts of the multilayer circuit laminate are assembled in their planned order and proper registry employing jig plates and locater pins. It is helpful to pad the assembly by placing a few sheets of heavy kraft paper between the plates of the jig and the platens of the press.

The assembled components are placed in a press such as a hydraulic press, and contact pressure is applied. The assembly is heated and the electrical impedance is measured as hereinabove described. It is preferred to employ a time lag prior to applying full laminating pressure to compensate for temperature gradients across the press platens.

Furthermore, it is preferred to treat the surfaces of the circuit layers prior to lamination to insure successful interlaminar bonds. The art accepted expedient has been to roughen the printed metallic circuit pattern surface by mechanical abrasion or chemical etching. An additional embodiment of the invention resides in the discovery that a successful interlaminar bond can be achieved by treating the printed metallic circuit pattern surfaces of the fully cured laminate circuit layer with an adhesive laminating resin. The adhesive laminating resin obviates the necessity for roughing the printed, metallic circuit pattern surfaces prior to lamination. However, the circuit layers may be pretreated with an adhesive laminating resin in conjunction with roughing to insure resin penetration between closely adjacent conductors.

A further embodiment of the invention resides in the discovery of an improved press, in which the press is adapted with electrical sensing means to enable the determination of the gel stage of the thermosetting resin of the heated laminate assemblies. The electrical sensing means may be a voltmeter, an ammeter, an ohmmeter and the like. Additionally, the electrical sensing means may be combined with a recorder, and an electronic controller, such as a differential amplifier with storage and comparison circuits. Therefore, as the thermosetting resin achieves its gel stage the press is automatically activated to apply full laminating pressure to the assembly at the proper time. Additionally, the press may be activated at a point in time subsequent to the initial indication of the gel stage of the resin to compensate for temperature gradients across the press platens.

The thermosetting resins employed with the base materials may be either epoxy, phenolic or polyester resins. The base materials may be impregnated with any one of said resins or a combination of same.

Typical of the thermosetting resins may be mentioned oil soluble phenolic type resins such as fusible copolymers of phenol resorcinol, a cresol or an xylenol with an aldehyde or with furfural. Illustrative of the polyester resins which are well known in the art and are prepared by reacting discarboxylic compounds with dihydric alcohols, for example, by the reaction of phthalic or maleic anhydride with mono-, di- or polyethylene glycols. The polyester resins are ordinarily dissolved in styrene monomer and cross-linked by reaction with the styrene. Lastly, illustrative of an epoxy resin which may be employed is the reaction product of epichlorohydrin with bisphenol A.

The thermosetting resins alone do not ordinarily have adequate tackiness or sufficient flexibility to resist heat shock. Furthermore, the thermosetting resins have little resistance to peeling of long conductor patterns from the surface of the resin. Therefore, the use of an adhesive resin together with a thermosetting resin provides a suitable composition for carrying conductor patterns as well as adhesively binding them to the base.

Typical of the adhesive resins are the epoxy resins, polyvinyl acetal resins, polyvinyl alcohol, polyvinyl acetate and the like. Also as the adhesive resins may be mentioned chlorinated rubber and butadiene acrylonitrile copolymers.

The adhesive resins of the type described have appended thereto polar groups such as nitrile, epoxide, acetal and hydroxyl groups. Such adhesive resins copolymerize with and plasticize the thermosetting resins, and impart good adhesive characteristics through the action of the polar groups.

Particularly suitable for use as an adhesive resin for certain substrates is a combination of a phenolic type resin and an epoxy resin. The most common epoxy resins for use in the resinous composition are copolymers of epichlorohydrin (1-chloro-2,3-epoxy propane) with bisphenol A (2,2-p-hydroxy phenyl propane) which have melting points within the range of 20°F to 375°F and molecular weights of about 350 to 15,000.

Lastly, the adhesive laminating resin can be epoxy resin, a blend of an epoxy resin andd a phenolic resin or a blend of an epoxy resin and an adhesive resin, which is preferred. The adhesive laminating resin should be a homogeneous system which when dried contains solid resin and catalyst. Furthermore, the resin should be capable of application as a liquid, as well as being capable of curing to a B stage having a dry, tack free surface; curing being effected by the application of moderate heat or solvent evaporation.

Although epichlorohydrin is the most important organic epoxide employed in the formation of the epoxy resins, other epoxides such as, for example, 1,2,3,4-diepoxy butane may be used. Similarly, epoxy resins derived from phenols other than bisphenol A are suitable for use. Such resins include, for example, the reaction product of epichlorohydrin with resorcinol, with phenols derived from cashew nut oils, with hydroquinone, with 1,5-dihydroxy napthalene or with 2,2,5,5-tetrabis-(4-hydroxy phenyl) hexane. Phenolic intermediates of the resol type, hydrazines and sulfonamides, such as, for example, 2,4-toluene disulfonamide, may also be used for reaction with an organic epoxide to produce epoxy resins suitable for us. Aliphatic epoxy resins are also suitable. Such resins are, for example, the reaction product of epichlorohydrin with glycerol, with ethylene glycol or with pentacrythritol.

The phenolic type resin may be a copolymer of phenol, resorcinol, a cresol or a xylenol with an aldehyde or with furfural. Thus, it may be a copolymer of phenol or a substituted phenol with formaldehyde or a formaldehyde-yielding material such as, paraformaldehyde or a hexamethylene tetramine. The phenolic resin is preferably of the oil soluble type. As examples of thermosetting phenolic type resins which may be used may be mentioned copolymers of formaldehyde with p-cresol, p-ethyl phenol, p-tert butyl phenol, p-tert amyl phenol, or a "bisphenol", such as 4,4-isopropylidene diphenol or 2,2-bis (p-hydroxy phenyl) propane. It may be of the modified type, such as, for example, one which has been modified with copal or rosin to cause it to be oil soluble.

The phenolic type resins are, themselves, curing agents for the epoxy resins, and even those which are, themselves, permanently fusible form a tough, adherent film in combination with an epoxy resin which is probably the result of a cross-linking between the epoxy resin and the phenolic type resin. However, the resinous compositions may contain an additional curing agent. This curing agent may be another resin, such as, for example, a polyamide resin, or a melamine-formaldehyde resin, or it may be, for example, a dibasic acid, such as, for example, phthalic anhydride, an amine, such as, for example, triethanolamine, diethylene triamine or metaphenylene diamine, or an amide, such as, for example, dicyandiamide.

When using a phenolic resin, a curing agent for the resin, such as, for example, one of the amines mentioned hereinabove as a curing agent for epoxy resin may be employed.

The following examples are provided for illustrative purposes and may include particular features of the invention; however, the examples should not be construed as limiting the invention, many variations of which are possible without departing from the spirit or scope thereof.

EXAMPLE I

PREPARATION OF A MULTILAYER CIRCUIT LAMINATE ASSEMBLY

This example demonstrates the preparation of a multilayer circuit laminate assembly which comprises fully cured laminate circuit layers having printed, copper circuit pattern surfaces and prepreg sheets.

The fully cured laminate circuit layers are prepared for lamination by etching the printed, copper circuit pattern surfaces of the circuit layers with an ammonium persulfate copper etch solution.

The prepreg sheets are prepared from No. 112 glass cloth impregnated with a resin composition comprising EPON 1001 epoxy resin supplied by Shell Chemical Co., which is defined as a copolymer of epichlorohydrin and bisphenol A having a molecular weight of over 875, dicyandiamide as a catalyst and aluminum silicate as a filler.

The assembly, comprising five circuit layers having two sheets of prepreg between each circuit board, is assembled in planned order and proper registry employing a jig plate and locator pins. A test probe comprising a copper circuit printed on polytetrafluoroethylene is inserted into the center of the assembly with the copper surface facing a prepreg sheet.

EXAMPLE II

PREPARATION OF A MULTILAYER CIRCUIT LAMINATE

This example demonstrates the preparation of a multilayer circuit laminate employing the novel improvements of the present invention.

A multilayer circuit laminate assembly, prepared in the manner set forth in Example I, is placed in a hydraulic press and the press is closed to contact pressure.

A lead providing a direct electric potential of 1.35 volts is connected to one lead of the test coupon. The second remaining lead of the test coupon is connected to a recording ohmmeter and the assembly is heated. The electrical impedance is measured as the assembly is heated, recording time, temperature and ohms.

The recorded measurements are set forth in the following table:

TABLE 1

| Time Minutes | Seconds | Temperature Fahrenheit | Impedance Ohms |
|---|---|---|---|
|  | 30 | 180° | 100 × 10⁶ |
|  | 50 | 220° | 35 × 10⁶ |
| 1 | 10 | 232° | 26 × 10⁶ |
| 1 | 30 | 240° | 18 × 10⁶ |
| 2 | 0 | 250° | 16 × 10⁶ |
| 2 | 20 | 255° | 14 × 10⁶ |
| 2 | 40 | 260° | 12 × 10⁶ |
| 3 | 10 | 262° | 10.5 × 10⁶ |
| 3 | 40 | 270° | 9.5 × 10⁶ |
| 4 | 10 | 272° | 9 × 10⁶ |
| 4 | 40 | 275° | 8.5 × 10⁶ |
| 5 | 5 | 276° | 8 × 10⁶ |
| 5 | 40 | 278° | 7.4 × 10⁶ |
| 6 | 0 | 280° | 7 × 10⁶ |
| 6 | 30 | 282° | 6.7 × 10⁶ |
| 7 | 5 | 283° | 6.4 × 10⁶ |
| 7 | 40 | 283° | 6.4 × 10⁶ |
| 8 | 5 | 283° | 6.4 × 10⁶ |
| 8 | 40 | 283° | 6.4 × 10⁶ |
| 9 | 10 | 284° | 6.5 × 10⁶ |
| 9' | 30 | 285° | 6.6 × 10⁶ |
| 9 | 45 | 286° | 6.7 × 10⁶ |
| 10 | 30 | 289° | 7 × 10⁶ |

The above measurements of impedance clearly indicate that at 9 minute and 10 seconds the thermosetting resin is entering its gel stage. A time lag of 20 seconds is allowed to elapse to compensate for the temperature gradients across the press platens and full laminating pressure of 250 psi is supplied at 9 minutes and 30 seconds.

Visual observation of the resulting multilayer circuit laminate indicates that successful interlaminar bonds were achieved.

EXAMPLE III

PREPARATION OF A MULTILAYER CIRCUIT LAMINATE

This example demonstrates the preparation of a multilayer circuit laminate employing the novel improvements of the present invention.

Two multilayer circuit assemblies, prepared in the manner set forth in Example I, are placed in hydraulic presses preheated to 345°F. and the presses are closed to contact pressure.

Two leads providing a direct current potential of 1.35 volts are connected to one of the leads of each of the test coupons of the assemblies. The remaining leads of the test coupons are connected to recording ohmmeters and the electrical impedance is measured. The recorded measurements are set forth in the following tables:

TABLE 2

| Test No. 1 | | |
|---|---|---|
| Time Minutes | Seconds | Impedance Ohms |
|  | 10 | 80 × 10⁶ |
|  | 20 | 50 × 10⁶ |
|  | 25 | 8 × 10⁶ |
|  | 30 | 4 × 10⁶ |
|  | 35 | 2 × 10⁶ |
|  | 45 | 60 × 10⁴ |
|  | 50 | 35 × 10⁴ |
| 1 | 0 | 30 × 10⁴ |
| 1 | 15 | 30 × 10⁴ |
| 1 | 30 | 30 × 10⁴ |
| 1 | 45 | 30 × 10⁴ |
| 1 | 50 | 35 × 10⁴ |
| 2 | 0 | 35 × 10⁴ |
| 2 | 10 | 40 × 10⁴ |
| 2 | 25 | 47 × 10⁴ |

TABLE 2-continued

| Time | | Impedance |
|---|---|---|
| Minutes | Seconds | Ohms |
| Test No. I | | |
| 2 | 30 | 50 × 10⁴ |

TABLE 3

| Time | | Impedance |
|---|---|---|
| Minutes | Second | Ohms |
| Test No. II | | |
|  | 10 | 15 × 10⁶ |
|  | 20 | 2.2 × 10⁶ |
|  | 30 | 100 × 10⁴ |
|  | 40 | 50 × 10⁴ |
|  | 45 | 40 × 10⁴ |
|  | 50 | 30 × 10⁴ |
| 1 | 0 | 28 × 10⁴ |
| 1 | 10 | 26 × 10⁴ |
| 1 | 20 | 26 × 10⁴ |
| 1 | 30 | 28 × 10⁴ |
| 1 | 40 | 30 × 10⁴ |
| 1 | 50 | 33 × 10⁴ |
| 2 | 0 | 35 × 10⁴ |

The thermosetting resin is apparently at its minimum viscosity when the measurement of impedance stabilizes at a low point. The duration of this period of low viscosity is a function of heat transfer rate.

In Test No. I full laminating pressure of 250 psi is applied at 2 minutes and 35 seconds, a full 45 seconds after the end of the low viscosity period. There is insufficient resin flow resulting in poor interlaminar bonds which is obvious upon visual examination of the multilayer circuit laminate. Blisters are visually apparent from the uneven surface of the laminate, as well as measles which show as white opaque spots in the laminate.

In Test No. II full laminating pressure of 250 psi is applied at 1 minute and 50 seconds, a full 50 seconds after the end of the low viscosity period. Visual observation indicates that successful interlaminar bonds were achieved.

EXAMPLE IV

PREPARATION OF A MULTILAYER CIRCUIT LAMINATE

This example demonstrates the use of adhesive laminating resins to prepare fully cured laminate circuit layers having printed, copper circuit pattern surfaces for lamination in multilayer circuit laminates. In particular, the example demonstrates that the necessity of roughing or etching the printed, copper circuit pattern surfaces of the circuit layer prior to lamination in a multilayer circuit laminate can be avoided by employing an adhesive laminating resin.

A multilayer circuit assembly is prepared in the manner set forth in Example I with the exception that the fully cured laminate circuit layers having printed, copper circuit pattern surfaces are prepared for lamination by applying to the surface of the circuit layers a composition comprising EPON 1001 epoxy resin supplied by Shell Chemical Co., which is defined as a copolymer of epichlorohydrin and bisphenol A, having a molecular weight of over 875, and dicyandiamide as a catalyst. The treated circuit layers are then heated in an oven of 250°F for 10 minutes.

The multilayer circuit assembly is then laminated employing the process set forth in Example II. Visual observation indicates that successful interlaminar bonds were achieved.

EXAMPLE V

This example demonstrates the preparation of a multilayer circuit laminate by measuring the electric current generated by heating the thermosetting resin.

A multilayer circuit laminate assembly, prepared in the manner set forth in Example I, is placed in a hydraulic press and the press is closed to contact pressure of 1.75 psi at 350°F.

Both leads of the test coupon are connected to a recording microammeter and as the assembly is heated, current will begin to flow between the leads of the test coupons.

The recording microammeter will monitor the voltage drop across the microammeter giving a plot of the characteristic of the electric current, and full laminating pressure of 250 psi is applied where the current begins to drop off.

Visual observation of the resulting multilayer circuit laminate indicates that successful interlaminar bonds were achieved.

Although the invention has been described and illustrated by reference to particular embodiments thereof, it will be understood that in its broadest aspects the invention is not limited to such embodiments and that variation and substitution of such equivalents may be resorted to within the scope of the appended claims.

What is claimed is:

1. In a laminating press for heating and laminating with thermosetting resins the improvement which comprises electrical sensing means for measuring the electrical properties of the gel stage of the thermosetting resin of a heated thermosetting laminating assembly as said resin is heated and means for applying pressure to said press when said electrical sensing means measures the gel stage to thereby thermoset the laminated assembly in said press.

2. The press according to claim 1 in which the electrical sensing means is a recording ohmmeter.

3. The press according to claim 1 in which the electrical sensing means is connected to an electronic controller.

4. The press according to claim 3 in which the electronic controller is a differential amplifier with storage and comparison circuits.

5. The press according to claim 1 in which hydraulic pressure is employed to operate said press.

* * * * *